US011453075B2

(12) United States Patent
Nishida

(10) Patent No.: US 11,453,075 B2
(45) Date of Patent: Sep. 27, 2022

(54) COMPONENT MOUNTING LINE CONTROL SYSTEM

(71) Applicant: Panasonic Intellectual Property Management Co., Ltd., Osaka (JP)

(72) Inventor: Hiroyoshi Nishida, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 173 days.

(21) Appl. No.: 16/913,076

(22) Filed: Jun. 26, 2020

(65) Prior Publication Data

US 2020/0324354 A1 Oct. 15, 2020

Related U.S. Application Data

(62) Division of application No. 15/700,305, filed on Sep. 11, 2017, now abandoned.

(30) Foreign Application Priority Data

Sep. 30, 2016 (JP) .................................. 2016-192820

(51) Int. Cl.
*B23K 1/00* (2006.01)
*H05K 13/04* (2006.01)
*B23K 101/42* (2006.01)

(52) U.S. Cl.
CPC ........ *B23K 1/0016* (2013.01); *B23K 2101/42* (2018.08); *H05K 13/04* (2013.01)

(58) Field of Classification Search
None
See application file for complete search history.

(56) References Cited

U.S. PATENT DOCUMENTS

| 5,439,160 | A | 8/1995 | Marcantonio |
| 5,971,249 | A * | 10/1999 | Berkin ............... B23K 1/008 228/102 |
| 6,600,137 | B1 | 7/2003 | Nonomura et al. |
| 6,757,966 | B2 | 7/2004 | Inoue et al. |
| 6,768,083 | B2 | 7/2004 | Rae et al. |

(Continued)

FOREIGN PATENT DOCUMENTS

| CN | 1658742 A | 8/2005 |
| JP | H06-132696 A | 5/1994 |

(Continued)

OTHER PUBLICATIONS

English Translation of Chinese Search Report dated Sep. 27, 2021 for the related Chinese Patent Application No. 201710870164.3.

*Primary Examiner* — Devang R Patel
(74) *Attorney, Agent, or Firm* — Pearne & Gordon LLP

(57) ABSTRACT

A component mounting line control system controls a component mounting line. The component mounting line control system includes an acquirer, a first detector, a second detector, and a controller. The acquirer acquires set-up changing data. The first detector is provided on the upstream side of the reflow device and detects the board. The second detector is provided on the downstream side of the reflow device and detects the board. The controller changes a reflow condition based on the set-up changing data and the result of detection performed by the first detector and the second detector after the acquirer acquires the set-up changing data.

3 Claims, 3 Drawing Sheets

(56) References Cited

U.S. PATENT DOCUMENTS

| | | | |
|---|---|---|---|
| 2012/0004759 A1 | 1/2012 | Ishimoto | |
| 2012/0011714 A1 | 1/2012 | Hattori et al. | |
| 2012/0272510 A1 | 11/2012 | Nishida | |
| 2013/0047427 A1 | 2/2013 | Yagi et al. | |
| 2013/0247370 A1 | 9/2013 | Kawase et al. | |

FOREIGN PATENT DOCUMENTS

| | | | |
|---|---|---|---|
| JP | H07-015133 A | | 1/1995 |
| JP | 2005-216958 A | | 8/2005 |
| JP | 3984466 B2 | | 10/2007 |
| JP | 2008135658 A | * | 6/2008 |
| JP | 2012-054463 A | | 3/2012 |
| WO | 2013/038456 A1 | | 3/2013 |

* cited by examiner

COMPONENT MOUNTING LINE CONTROL SYSTEM

CROSS REFERENCE TO RELATED APPLICATION(S)

This application is a division of U.S. patent application Ser. No. 15/700,305 filed on Sep. 11, 2017, which claims the priority from Japanese Patent Application No. 2016-192820 filed on Sep. 30, 2016, the entire contents of which are incorporated herein by reference.

BACKGROUND

1. Technical Field

The present disclosure relates to a component mounting line control system that controls a component mounting line for manufacturing a component-mounted board.

2. Description of the Related Art

The component mounting line for manufacturing a component-mounted board is configured to include a plurality of devices such as a printing device, a component mounting device, and a reflow device. The printing device prints solder on a board. The component mounting device such as a component placing device places a component on the board on which the solder has been printed. The board with the component mounted thereon is heated by the reflow device while being transported so that the solder is molten and solidified and the component is soldered to a wiring circuit provided on the board. In the reflow device, a reflow operation needs to be performed in accordance with a reflow condition such as a heating profile that is predetermined according to the kind of the board on which the component mounting device places the component. Therefore, as a component mounting line in which a plurality of kinds of boards are manufacturing targets, a component mounting line including a reflow device that supports a plurality of kinds of reflow conditions is known (for example, refer to PTL 1).

In the related art disclosed in PTL 1, a component mounting line includes a plurality of reflow devices each of which has a different heating profile depending on the kind of a board and a board transported from the upstream side is supplied to a reflow device having a heating profile that matches the board. According to this configuration, adjustment for switching a reflow condition, which is performed when there is a change in kind of the board, takes no time and thus it is possible to suppress a decrease in operating rate which occurs when the component mounting line is stopped.

CITATION LIST

Patent Literature

PTL 1: Japanese Patent No. 3984466

SUMMARY

A component mounting line control system controls a component mounting line.

The component mounting line includes a component mounting device and a reflow device.

The component mounting device places a component on a board onto which solder is applied.

The reflow device heats the board so that the solder is molten and solidified.

The component mounting line control system includes an acquirer, a first detector, a second detector, and a controller.

The acquirer acquires set-up changing data.

The first detector is provided on the upstream side of the reflow device and detects the board.

The second detector is provided on the downstream side of the reflow device and detects the board.

The controller changes a reflow condition based on the set-up changing data and the result of detection performed by the first detector and the second detector after the acquirer acquires the set-up changing data.

DETAILED DESCRIPTION

In the related art disclosed in PTL 1, since a plurality of reflow devices are provided, a configuration and of each reflow device and a process for controlling each reflow device are complicated. Therefore, the related art is not necessarily practical in view of achieving low-cost equipment having a simple configuration. Furthermore, in the related art, it is not possible to monitor a manufacturing state in each reflow device and it is difficult to perform an operation accompanied by switching of the kind of a board at a proper time. The temperature in a reflow device being operated becomes high due to a heating process and thus it is difficult to dispose a sensor for detecting a board therein. Therefore, it is not possible to accurately detect a flowing state of a board in a reflow device. Therefore, it is difficult to promptly perform an operation accompanied by switching of the kind of a board such as an operation of changing a reflow condition at a proper time. As a result, there is a time for which a component mounting line is stopped and thus a decrease in operating rate and a decrease in manufacturing efficiency occur.

Figure 1:
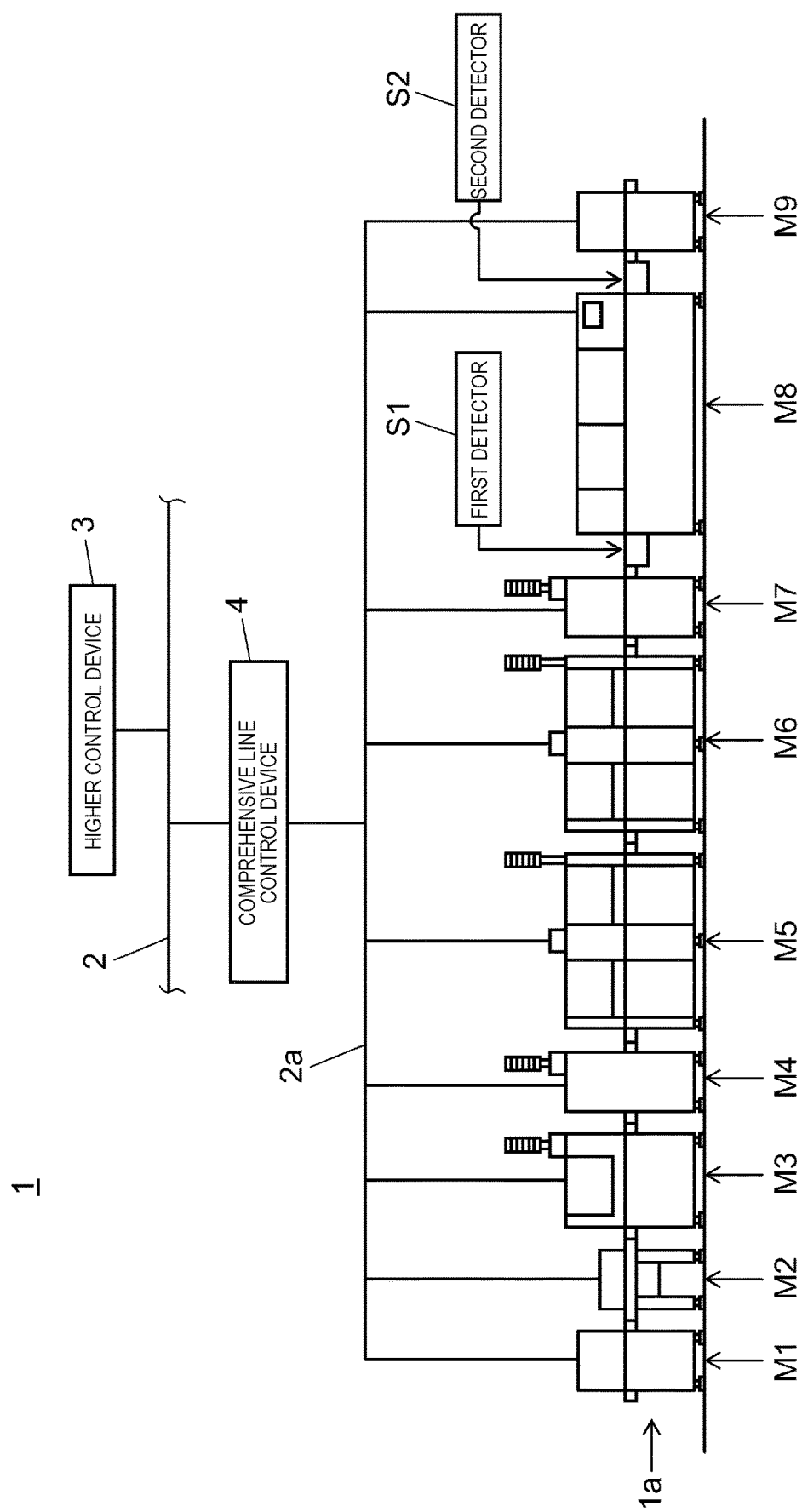
FIG. 1 a diagram for explaining a configuration of a component mounting system according to an embodiment.

Next, an embodiment of the present disclosure will be described with reference to drawings. First, a configuration of component mounting system 1 will be described with reference to FIG. 1. Component mounting system 1 has a function of manufacturing a component-mounted board by mounting an electronic component on a board through soldering. Component mounting system 1 includes component mounting line 1*a* in which a plurality of component mounting devices (which will be described later) are connected to each other and comprehensive line control device 4 that is connected to the plurality of component mounting devices via communication network 2*a* and comprehensively controls component mounting line 1*a*.

Another component mounting line (not shown) may be disposed in component mounting system 1. Each device in the other component mounting line is connected to another comprehensive line control device. The plurality of comprehensive line control devices are connected to higher control device 3 via communication network 2 and higher control device 3 has a function of comprehensively controlling the plurality of comprehensive line control devices.

Next, a configuration of component mounting line 1a according to the embodiment will be described. Each component mounting line 1a is configured by connecting board supplying device M1, board transferring device M2, printing device M3, printing inspection device M4, first component placing device M5, second component placing device M6, and placement state inspecting device M7, reflow device M8, and board retrieving device M9, each of which is a component mounting device, in series. That is, component mounting line 1a is configured to include the plurality of component mounting devices each of which places a component on a board and reflow device M8 that heats a board on which a component has been placed through solder while transporting the board so that the solder is molten and solidified.

Each component mounting device in component mounting line 1a has a board transporting mechanism for transporting a board and a board transportation path is formed with the board transporting mechanisms being connected in series. In component mounting line 1a, printing device M3, printing inspection device M4, first component placing device M5, second component placing device M6, placement state inspecting device M7, and reflow device M8 perform a component mounting operation of mounting a component on a board that is transported along the board transportation path after being supplied by board supplying device M1 and being transferred by board transferring device M2.

That is, a board supplied by board supplying device M1 is transported into printing device M3 via board transferring device M2 and a solder printing operation of printing solder for bonding a component on the board through a screen printing process is performed in printing device M3. The board after the solder printing operation is transferred to printing inspection device M4 and a printing inspection operation for the solder printed on the board is performed in printing inspection device M4. The board after the printing inspection operation is transferred to first component placing device M5 and second component placing device M6 sequentially and a component placing operation of placing a component on the board after the solder printing operation is performed in each of first component placing device M5 and second component placing device M6. The board after the component placing operation is transported into placement state inspecting device M7 and a placement state inspecting operation for the component placed on the board is performed in placement state inspecting device M7.

The board after the placement state inspecting operation is transported into reflow device M8. In reflow device M8, the board is heated according to a heating profile prescribed in a reflow condition for the board so that the solder for bonding the component is molten and solidified. Accordingly, the component is soldered to the board and a component-mounted board, which is obtained by mounting a component on a board, is completed. The component-mounted board is retrieved by board retrieving device M9.

In component mounting line 1a, the operation processes performed by board supplying device M1 to placement state inspecting device M7 which are positioned on the upstream side of reflow device M8 correspond to an upstream process with respect to reflow device M8. In the embodiment, first detector S1 that detects a board is provided on the upstream side of reflow device M8 and second detector S2 that detects a board is provided on the downstream side of reflow device M8.

First detector S1 and second detector S2 have a function of detecting whether there is a board that is transported after being subject to the upstream process and reading an identification mark such as a bar code stuck onto a board. As first detector S1 and second detector S2, various detectors such as a dedicated bar code reader or an imaging camera having an image recognizing function can be used. Since first detector S1 and second detector S2 are disposed on the upstream side and the downstream side of reflow device M8 so that first detector S1 and second detector S2 monitor a board entering or exiting reflow device M8, it is possible to confirm whether a board is present in reflow device M8.

In component mounting line 1a, a plurality of kinds of boards, which are different in reflow condition, are manufacturing targets. Therefore, it is necessary to perform a set-up changing operation (preparing operation) such as an operation of changing a reflow condition for each time the kind of a board is switched in the middle of manufacture. The set-up changing operation accompanying a change in reflow condition needs to be performed in a state where no board is present in reflow device M8. However, since the inside of reflow device M8 is heated and reflow device M8 is closed when reflow device M8 is operated, it is difficult to visually recognize presence or absence of a board from the outside. In addition, since the inside of reflow device M8 is heated to a high temperature, a sensor for detecting a board cannot be disposed therein and it is difficult to achieve automated board detection.

Therefore, in the component mounting line in the related art, it is difficult to properly determine a time for performing the set-up changing operation accompanying a change in reflow condition, which results in a time taken for the set-up changing operation being lengthened and a decrease in operating rate of component mounting line 1a. In consideration of such a problem that is peculiar to the characteristics of reflow device M8, in component mounting line 1a according to the embodiment, entering and exiting of a board with respect to reflow device M8 is managed to estimate a transportation state of a board in reflow device M8 and a proper time for performing the set-up changing operation accompanying a change in reflow condition is determined based on the result of estimation. Hereinafter, a configuration of a component mounting line control system which component mounting system 1 includes for realizing the above-described function will be described with reference to FIG. 2.

Figure 2:
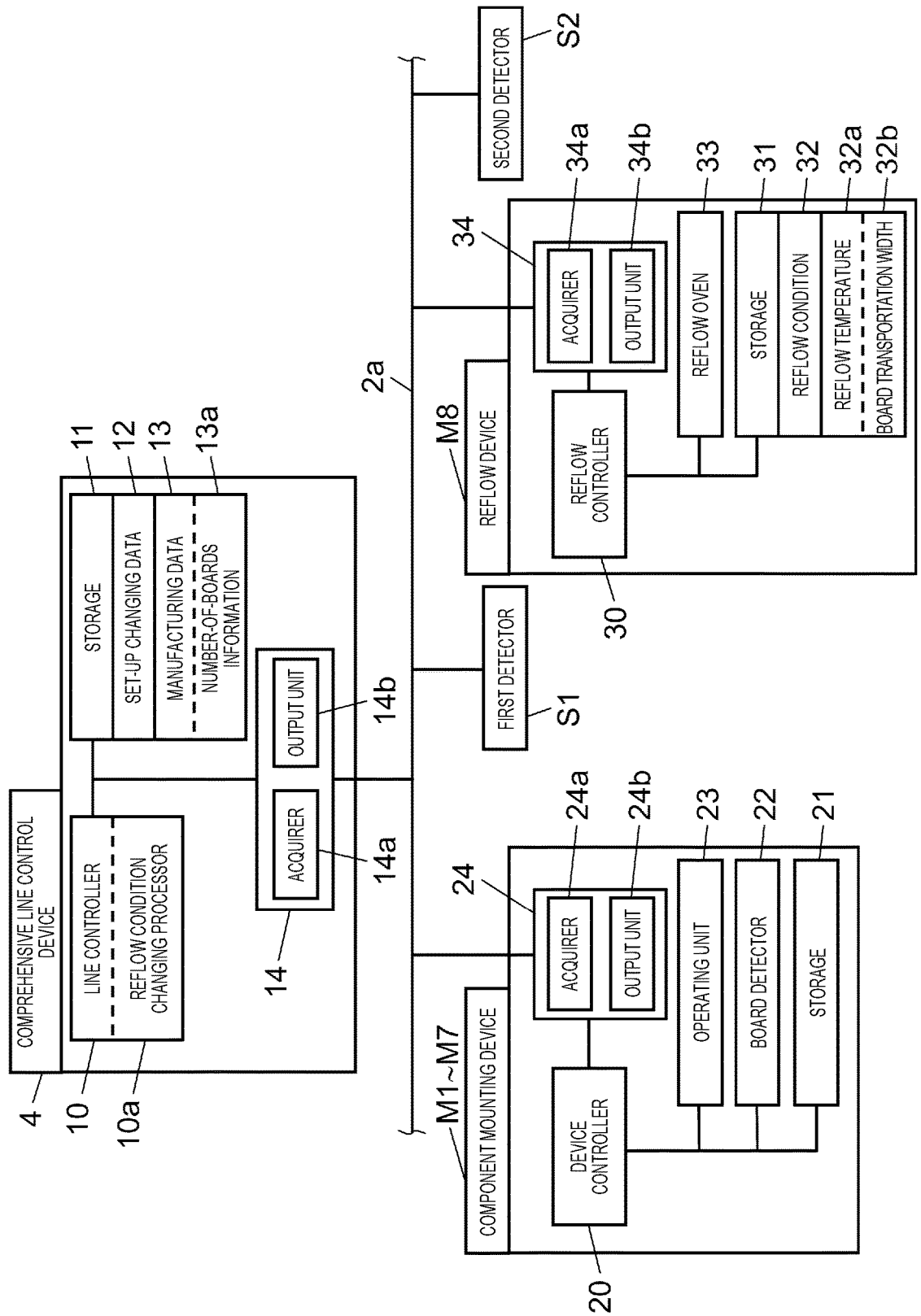
FIG. 2 is a block diagram illustrating a configuration of a controlling system in a component mounting line control system according to the embodiment.

In FIG. 2, comprehensive line control device 4 includes line controller 10, storage 11, and communicator 14. Line controller 10 has a function as a controller in the component mounting line control system which controls each device in component mounting line 1a. Line controller 10 is provided with reflow condition changing processor 10a and reflow condition changing processor 10a has a function of performing a process of changing a reflow condition in reflow device M8.

Storage 11 stores data necessary for comprehensive line control device 4 to control each device in component mounting line 1a. The above-described data includes set-up changing data 12 for performing the set-up changing operation accompanied by switching of the kind of a board which is a manufacturing target, manufacturing data 13 which is referred to when a component-mounted board is manufactured, or the like. That is, acquirer 14a acquires set-up changing data 12 and line controller 10 (controller) changes a reflow condition in reflow device M8 based on acquired set-up changing data 12.

Manufacturing data 13 includes number-of-boards information 13a, that is, information indicating the number of boards per lot of component-mounted boards which are manufacturing targets. If first detector S1 on the upstream side detects boards of which the number is the same as that of a specific lot of boards and second detector S2 on the downstream side detects boards of which the number is the same as that of the specific lot of boards, it is confirmed that the specific lot of boards are not present in reflow device M8 at that time. The change in reflow condition in reflow device M8 in the embodiment is made after it is confirmed whether a board is present in reflow device M8 by using first detector S1 and second detector S2 in this manner.

Alternatively, it may be confirmed that a board is not present in reflow device M8 if second detector S2 on the downstream side detects boards of which the number is the same as that indicated by number-of-boards information 13a. Alternatively, it may be confirmed that a board is not present in reflow device M8 if first detector S1 on the upstream side detects boards of which the number is the same as that indicated by number-of-boards information 13a and second detector S2 on the downstream side detects boards of which the number is the same as that indicated by number-of-boards information 13a.

Communicator 14 is a communication interface and includes acquirer 14a and output unit 14b. Acquirer 14a acquires information from each component mounting device constituting component mounting line 1a via communication network 2a. Furthermore, acquirer 14a acquires information from higher control device 3 via communication network 2. The acquired information includes set-up changing data 12 and manufacturing data 13 and the acquired data is stored in storage 11. Output unit 14b outputs information from line controller 10 to each of the devices.

Each of the component mounting devices (here, board supplying device M1 to placement state inspecting device M7) includes device controller 20, storage 21, board detector 22, operating unit 23, and communicator 24. Device controller 20 is a control device that controls each unit in the corresponding device and controls operating unit 23 of the component mounting device while being controlled based on information from line controller 10 of comprehensive line control device 4. Operating unit 23 is a unit having a function of performing an individual operation corresponding to the kind of each device. When operating unit 23 is controlled, operation execution data stored in storage 21 is referred to in some cases.

Board detector 22 is a board identifying device such as a bar code reader and has a function of reading an identification mark such as a bar code on a board that is transported into each device from the upstream side and identifying the kind of the board. Communicator 24 is a communication interface and includes acquirer 24a and output unit 24b. Acquirer 24a acquires information from comprehensive line control device 4 via communication network 2a. Furthermore, acquirer 24a acquires information from higher control device 3 via communication network 2.

Output unit 24b outputs information from device controller 20 to comprehensive line control device 4, for these devices as subjects. The output information includes the result of identification performed by board detector 22 for identifying the kind of a board. Accordingly, comprehensive line control device 4 confirms that the kind of a board which is a manufacturing target has been switched. It is determined whether a change in reflow condition accompanying switching of the kind of a board is necessary or not and reflow device M8 is commanded to change a reflow condition in a case where the change in reflow condition is necessary.

Reflow device M8 includes reflow controller 30, storage 31, reflow oven 33, and communicator 34. Reflow controller 30 is a control device that controls each unit in reflow device M8 and controls reflow oven 33 while being controlled based on information from line controller 10 of comprehensive line control device 4. At this time, reflow condition 32, which is transmitted from comprehensive line control device 4 and stored in storage 31, is referred to. Reflow condition 32 includes reflow temperature 32a and board transportation width 32b and the width of a reflow conveyer in reflow oven 33 and the temperature of each heating zone are set to a condition corresponding to the kind of a board based on reflow temperature 32a and board transportation width 32b.

Communicator 34 is a communication interface and includes acquirer 34a and output unit 34b. Acquirer 34a acquires information from comprehensive line control device 4 via communication network 2a and acquires information from higher control device 3 via communication network 2. The acquired information includes information related to a change in reflow condition accompanying the set-up changing operation which is performed when the kind of a board which is a manufacturing target is switched. Output unit 34b outputs information from reflow controller 30 to the devices.

First detector S1 is disposed on the upstream side of reflow device M8 and second detector S2 is disposed on the downstream side of reflow device M8. When reflow condition 32 in reflow device M8 is changed, acquirer 14a of comprehensive line control device 4 acquires set-up changing data 12 for changing reflow condition 32 in reflow device M8. Thereafter, reflow condition 32 is changed based on the result of detection performed by first detector S1 and second detector S2 due to the function of reflow condition changing processor 10a. That is, line controller 10 changes reflow condition 32 after first detector S1 and second detector S2 detect that no board is present in reflow device M8.

Next, a specific example of a board detecting method will be described. If first detector S1 detects boards of which the number is the same as that of a specific lot of boards and second detector S2 detects boards of which the number is the same as that of the specific lot of boards, it is found that the specific lot of boards are not present in reflow device M8 at that time. That is, in a case where the number of boards detected by first detector S1 and the number of boards detected by second detector S2 are the same as each other, it is found that a specific lot of boards are not present in reflow device M8 at that time. Alternatively, storage 11 of comprehensive line control device 4 stores manufacturing data 13 including number-of-boards information 13a for manufacturing boards. In a case where the number of boards detected by second detector S2 is the same as the number of boards indicated by number-of-boards information 13a, it is found that a specific lot of boards are not present in reflow device M8 at that time. Alternatively, in a case where the number of boards detected by first detector S1 and second detector S2 corresponds to the number of boards indicated by number-of-boards information 13a, it is found that a specific lot of boards are not present in reflow device M8 at that time.

In some cases, a board may be removed from component mounting line 1a with the board being lost at a certain position on the upstream side of first detector S1 or the like. In consideration of a case where the number of boards decreases in this manner, it is preferable to confirm whether a board is not present in reflow device M8 based on the result of detection performed by first detector S1 and second detector S2.

Reflow condition 32 is changed after it is confirmed that no board is present in reflow device M8 in this manner. That is, when line controller 10 according to the embodiment changes reflow condition 32, reflow condition 32 is changed in a case where the number of boards detected by first detector S1 corresponds to the number of boards detected second detector S2.

Alternatively, reflow condition 32 is changed in a case where the number of boards detected by second detector S2 corresponds to number-of-boards information 13a stored in storage 11. Alternatively, reflow condition 32 is changed in a case where the number of boards detected by first detector S1 and second detector S2 corresponds to number-of-boards information 13a stored in storage 11. In a case where a board is removed from the component mounting devices (here, board supplying device M1 to placement state inspecting device M7) or placed on the component mounting devices again, number-of-boards information 13a stored in storage 11 is updated corresponding to the number of boards in that situation.

Figure 3:
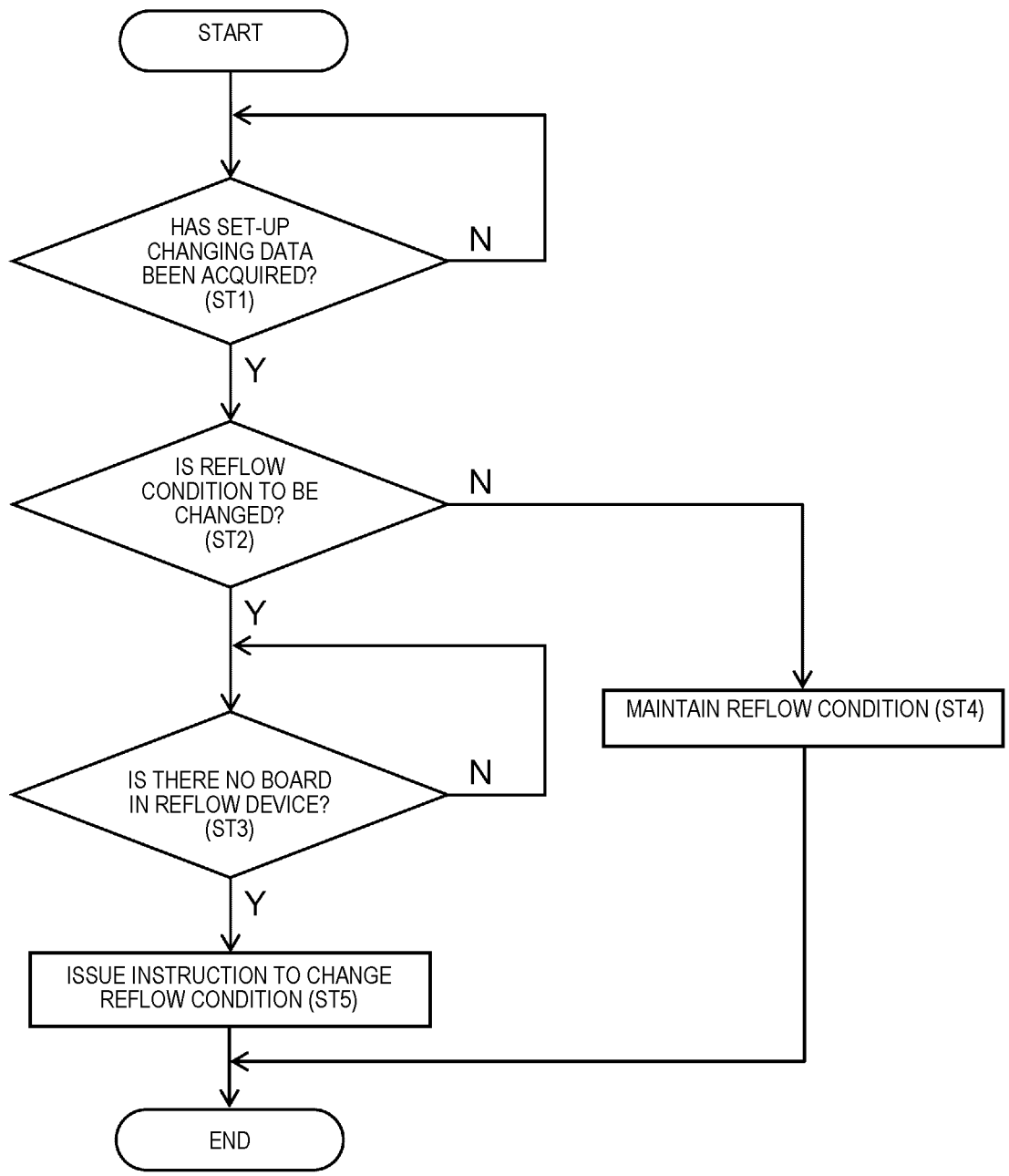
FIG. 3 is a flow chart illustrating a reflow condition changing process in the component mounting line control system according to the embodiment.

Next, a reflow condition changing process in the component mounting line control system according to the embodiment will be described with reference to a flow chart in FIG. 3. First, in a state where component mounting line 1a is operated, line controller 10 confirms whether acquirer 14a of comprehensive line control device 4 has acquired set-up changing data 12 (ST1). Set-up changing data 12 is acquired when board detector 22 of each component mounting device corresponding to the upstream process for reflow device M8 (here, board supplying device M1 to placement state inspecting device M7) in component mounting line 1a reads identification information such as a bar code on a board and comprehensive line control device 4 acquires the result of the identification.

Next, it is determined whether to change the reflow condition (ST2). That is, in a case where reflow condition 32 currently set for reflow device M8 corresponds to a newly acquired set-up changing data and it is determined that it is not necessary to change reflow condition 32, current reflow condition 32 is maintained (ST4). On the other hand, in a case where reflow condition 32 currently set for reflow device M8 does not correspond to a newly acquired set-up changing data, it is determined that it is necessary to change reflow condition 32 and a process for changing the reflow condition is started.

First, it is confirmed whether a board is present in reflow device M8 (ST3). As described above, the determination on whether a board is present in reflow device M8 is performed by line controller 10 determining whether the number of boards detected by first detector S1 corresponds to the number of boards detected second detector S2.

Alternatively, line controller 10 determines whether the number of boards detected by second detector S2 corresponds to number-of-boards information 13a stored in storage 11. Alternatively, line controller 10 determines whether the number of boards detected by first detector S1 and second detector S2 corresponds to number-of-boards information 13a stored in storage 11.

The result of detection performed by first detector S1 and second detector S2 is continuously monitored until it is confirmed that no board is present in reflow device M8. In a case where it is confirmed no board is present in reflow device M8 in (ST3), line controller 10 issues an instruction to change the reflow condition (ST5). In this manner, a process of changing reflow condition 32 to be applied for reflow device M8 is performed by using the function of reflow condition changing processor 10a and a reflow operation according to newly changed reflow condition 32 is performed as a reflow operation in reflow oven 33.

As described above, the component mounting line control system according to the embodiment has a function of controlling component mounting line 1a. Component mounting line 1a includes the plurality of component mounting devices and reflow device M8. Each of the component mounting devices such as board supplying device M1 to placement state inspecting device M7 places a component on a board onto which solder is applied. Reflow device M8 heats the board while transporting the board so that the solder is molten and solidified.

The component mounting line control system includes acquirer 14a, line controller 10, first detector S1, and second detector S2. Acquirer 14a acquires the set-up changing data. Line controller 10 changes a reflow condition based on the acquired set-up changing data. First detector S1 is provided on the upstream side of reflow device M8 and detects the board. Second detector S2 is provided on the downstream side of reflow device M8 and detects the board.

After acquirer 14a acquires the set-up changing data for changing the reflow condition, the reflow condition is changed after it is confirmed that no board is present in reflow device M8 based on the result of detection performed by first detector S1 and second detector S2.

Accordingly, it is possible to determine a time at which no board is present in reflow device M8 and it is possible to perform an operation for changing the reflow condition in a case where a plurality of kinds of boards, which are different in reflow condition, are manufacturing targets. That is, it is possible to perform an operation such as an operation of changing a reflow condition accompanying switching of the kind of a board at a proper time with a simple configuration. As a result, it is possible to prevent a decrease in operating rate of component mounting line 1a and to improve the manufacturing efficiency.

According to the present disclosure, it is possible to perform an operation such as an operation of changing a reflow condition accompanying switching of the kind of a board at a proper time with a simple configuration and it is possible to prevent a decrease in operating rate of a component mounting line and to improve the manufacturing efficiency.

According to the component mounting line control system in the present disclosure, it is possible to perform an operation such as an operation of changing a reflow condition accompanying switching of the kind of a board at a proper time with a simple configuration and it is possible to prevent a decrease in operating rate of a component mounting line and to improve the manufacturing efficiency. Therefore, the component mounting line control system is useful for the field of component mounting technologies for manufacturing a board by mounting a component on a board through soldering.

What is claimed is:

1. A component mounting line control process comprising:
    detecting, by a first sensor, a number of boards that enter a reflow device, the first sensor disposed at an upstream side of the reflow device;
    detecting, by a second sensor, a number of boards that exit the reflow device, the second sensor disposed at a downstream side of the reflow device;

acquiring set-up changing data to change a reflow condition of the reflow device, the set-up changing data including a heat profile to heat a board in the reflow device;

determining whether to make a change on a reflow condition of the reflow device based on the acquired set-up changing data;

determining a timing to apply the change on the reflow condition to the reflow device, the timing being determined based on the detected numbers of the boards from the first and second sensors; and applying the change on the reflow condition to the reflow device at the determined timing according to the acquired set-up changing data.

2. The component mounting line control process of claim 1, further comprising:

reading an identification mark of the board, wherein the set-up changing data is acquired from a storage based on the read identification mark.

3. The component mounting line control process of claim 1, further comprising:

wherein the timing is determined that no board is present in the reflow device when the detected number of boards entering the reflow device is equal to the detected number of boards exiting the reflow device.

* * * * *